United States Patent

Noguchi et al.

[11] Patent Number: 5,859,603
[45] Date of Patent: Jan. 12, 1999

[54] SIGNAL PROCESSING APPARATUS AND METHOD FOR SOUND FIELD PROCESSING OF Σ-Δ MODULATED DIGITAL SIGNAL

[75] Inventors: Masayoshi Noguchi, Chiba; Gen Ichimura, Tokyo, both of Japan

[73] Assignee: Sony Corporation, Tokyo, Japan

[21] Appl. No.: 887,324

[22] Filed: Jul. 2, 1997

[30] Foreign Application Priority Data

Jul. 31, 1996 [JP] Japan ................................ 8-202187

[51] Int. Cl.[6] .................................................. H03M 7/32
[52] U.S. Cl. ................................................. 341/77; 341/61
[58] Field of Search .............................. 341/50, 61, 143, 341/131, 76, 77; 704/230, 226

[56] References Cited

U.S. PATENT DOCUMENTS

| 5,191,331 | 3/1993 | Karema et al. ........................ 341/131 |
| 5,241,310 | 8/1993 | Tiemann .................................. 341/143 |
| 5,243,345 | 9/1993 | Naus et al. .............................. 341/143 |
| 5,420,892 | 5/1995 | Okamoto .................................. 375/350 |
| 5,682,161 | 10/1997 | Ribner et al. ......................... 341/143 |
| 5,701,124 | 12/1997 | Ichimura et al. ....................... 341/50 |
| 5,742,246 | 4/1998 | Kuo et al. .............................. 341/143 |

*Primary Examiner*—Howard L. Williams
*Assistant Examiner*—Peguy Jean Pierre
*Attorney, Agent, or Firm*—Jay H. Maioli

[57] ABSTRACT

A signal processing method and apparatus for performing special-effects processing on a 1 bit ΣΔ modulated signal in which, for amplitutde limiting a ΣΔ modulated 1-bit digital signal, the 1-bit digital signal is temporarily converted into a multi-bit signal. For re-quantizing the converted multi-bit signal, an integrator constituting a ΣΔ re-modulator is controlled by a limiter. This enables the 1-bit digital signal to be amplitude-controlled in the form of the digital signal without converting the 1-bit digital signal into an analog signal.

6 Claims, 8 Drawing Sheets

FIG.4A BIT LENGTH CONVERSION SIGNAL $S_M$
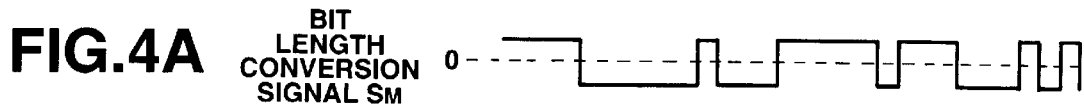
FIG.4B INPUT SIGNAL TO FIRST INTEGRATOR WITH LIMITER $S_I$
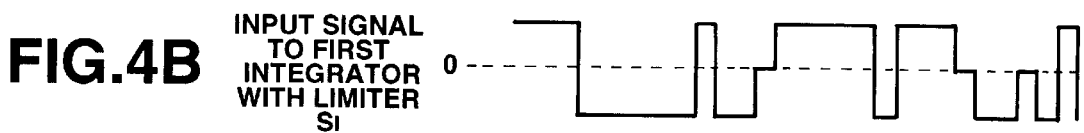
FIG.4C LIMITER INPUT VALUE $S_L$
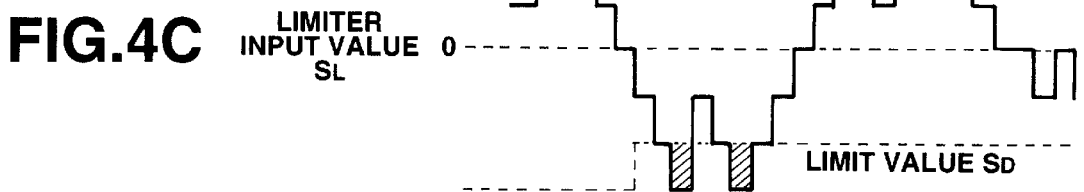
LIMIT VALUE $S_D$
LIMIT VALUE $S_D$
FIG.4D EFFECT CONTROL SIGNAL $S_E$    ON / OFF
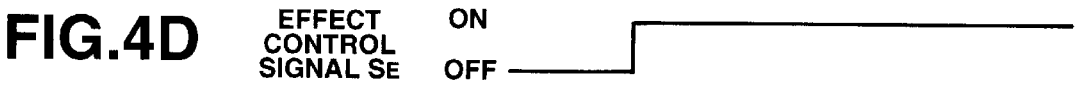
FIG.4E OUTPUT SIGNAL OF FIRST INTEGRATOR WITH LIMITER $S_O$
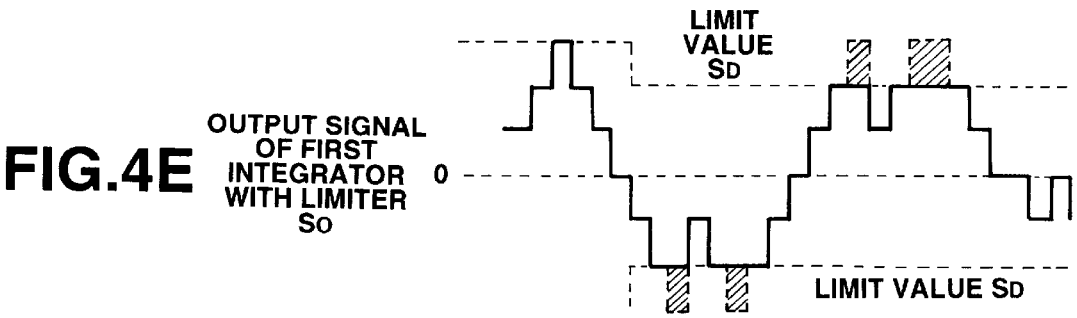
LIMIT VALUE $S_D$
LIMIT VALUE $S_D$

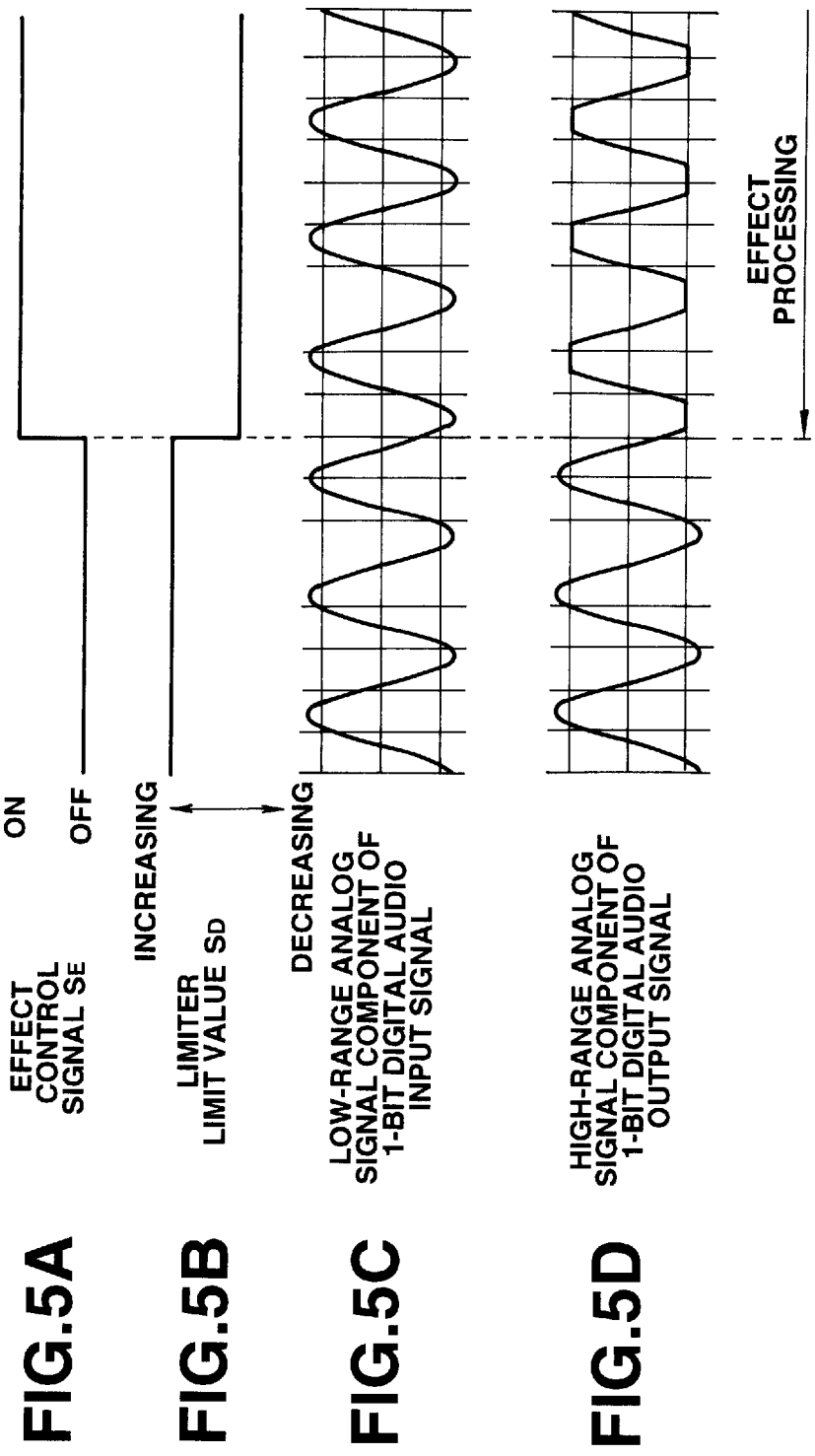

FIG.8A  INPUT SIGNAL S₁ TO FIRST INTEGRATOR WITH EFFECT CONTROLLER
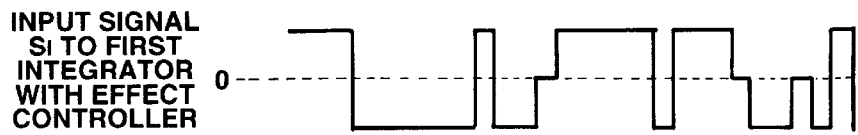
FIG.8B  INTEGRATED VALUE S_G OF FIRST INTEGRATOR
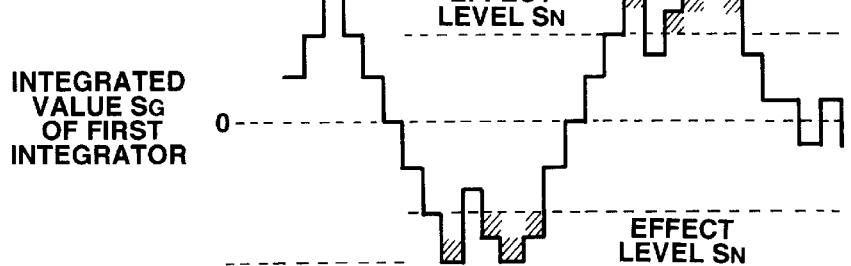
FIG.8C  EFFECT CONTROL SIGNAL S_E
FIG.8D  EFFECT LEVEL OVER DETECTION SIGNAL S_D
FIG.8E  EFFECT OFFSET VALUE S_J
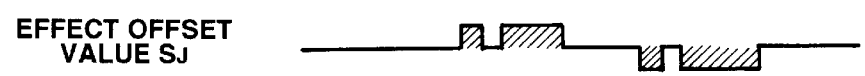
FIG.8F  OUTPUT SIGNAL S_O OF FIRST INTEGRATOR WITH EFFECT CONTROLLER

SIGNAL PROCESSING APPARATUS AND METHOD FOR SOUND FIELD PROCESSING OF Σ-Δ MODULATED DIGITAL SIGNAL

BACKGROUND OF THE INVENTION

1. Field of the Invention

This invention relates to a special effect processing device for performing special-effect processing on a 1-bit digital signal obtained by ΣΔ modulation.

2. Description of the Related Art

A ΣΔ modulated fast 1-bit signal is of the form of an extremely high sampling frequency and a short data word length, such as a sampling frequency equal to 64 times 44.1 kHz and a data word length of 1 bit, thus exhibiting a broad transmission frequency range as compared to a so-called multi-bit digital signal with a sampling frequency equal to 44.1 kHz and a data word length of 16 bits so far used in conventional digital audio. The audio range of 20 kHz is sufficiently lower than the over sampling frequency equal to 64 times 44.1 kHz thus assuring a high dynamic range. This feature can be exploited for application in a high sound quality recorder or for data transmission.

A circuitry employing ΣΔ modulation itself is not new and is frequently used in an A/D converter because the circuit structure lends itself to IC implementation and enables an analog to digital converter to be produced relatively easily. A ΣΔ modulated signal can be passed through an analog low-pass filter having a simpler structure for conversion to an analog audio signal.

On the other hand, it has been difficult to directly apply a special effect processing, such as distortion processing, indispensable for a digital audio editor, to the fast 1-bit audio signal. Thus there is no alternative but to apply special effect processing to the analog signal and to convert the analog signal processed by ΣΔ modulation into a fast 1-bit audio signal.

Meanwhile, for producing the fast 1-bit audio signal, processed with special effect processing by the method described above, an analog effector device is required for applying a special effect processing on the analog audio signal. On the other hand, if an audio signal in a 1-bit form is processed with special effect processing, it needs to be reverted to an analog audio signal to which a special effect processing and ΣΔ modulation needs to be applied, thus complicating the circuit structure. In addition, the 1-bit signal is transiently converted into an analog audio signal, thus lowering the signal quality of the 1-bit audio signal.

SUMMARY OF THE INVENTION

It is therefore an object of the present invention to provide a special effect device capable of directly applying special effect processing on a 1-bit digital signal by a simplified structure.

According to the present invention, there is provided a signal processing device for sound field processing a 1-bit digital signal obtained on ΣΔ modulation including conversion means for converting the 1-bit digital signal into a multi-bit signal, ΣΔ re-modulation means including an integrator for ΣΔ re-modulating the multi-bit signal as converted by the conversion means, and limiting value control means for controlling the limit value of the integrator making up the ΣΔ re-modulation means.

With the special effect processing device according to the present invention, a multi-bit output of conversion means converting a 1-bit digital signal into a multi-bit signal is ΣΔ re-modulated by an integrator of ΣΔ re-modulation means and a limiting value of the integrator is controlled by limiting value control means, so that a special effect processing can be directly applied by a simplified structure to the 1-bit digital signal.

In addition, with the special effect processing device according to the present invention, a multi-bit output of conversion means converting a 1-bit digital signal into a multi-bit signal is ΣΔ re-modulated by an integrator of ΣΔ re-modulation means and the integrated value is controlled by control means, so that a special effect processing can again be directly applied by a simplified structure to the 1-bit digital signal.

BRIEF DESCRIPTION OF THE DRAWINGS

FIG. 4A shows a bit length conversion signal SM as converted by a bit length converter.

FIG. 4B shows a signal SI entering a first integrator with a limiter.

FIG. 4C shows a limiter input value SL limiting-controlled in the first integrator with a limiter.

FIG. 4D shows an effect control signal SE as a trigger for effecting limit processing on the limiter input value SL.

FIG. 4E shows a signal SO outputted by the first integrator with a limiter.

FIG. 5A shows an effect control signal SE as a trigger for effecting limit processing on the limiter input value SL.

FIG. 5B shows a limiting value SD of a limiter.

FIG. 5C shows a low-range analog signal component of a 1-bit digital audio input signal.

FIG. 5D shows a low-range analog signal component of a 1-bit digital audio input signal limiting-processed with the effect control signal SE as a trigger.

FIG. 8A shows a signal SI entering the first integrator with an effect controller.

FIG. 8B shows an integrated value SG of the first integrator limit-controlled in the first integrator with an effect controller.

FIG. 8C shows an effect control signal SE as a trigger for effecting limiting processing on the integrated value SG of the first integrator.

FIG. 8D shows an effect level-over detection signal SD.

FIG. 8E shows an offset value SJ summed to the integrated value SG of the first integrator based on the effect level-over detection signal SD.

FIG. 8F shows a signal SO outputted by the first integrator with an effect controller.

DESCRIPTION OF THE PREFERRED EMBODIMENTS

Figure 1:
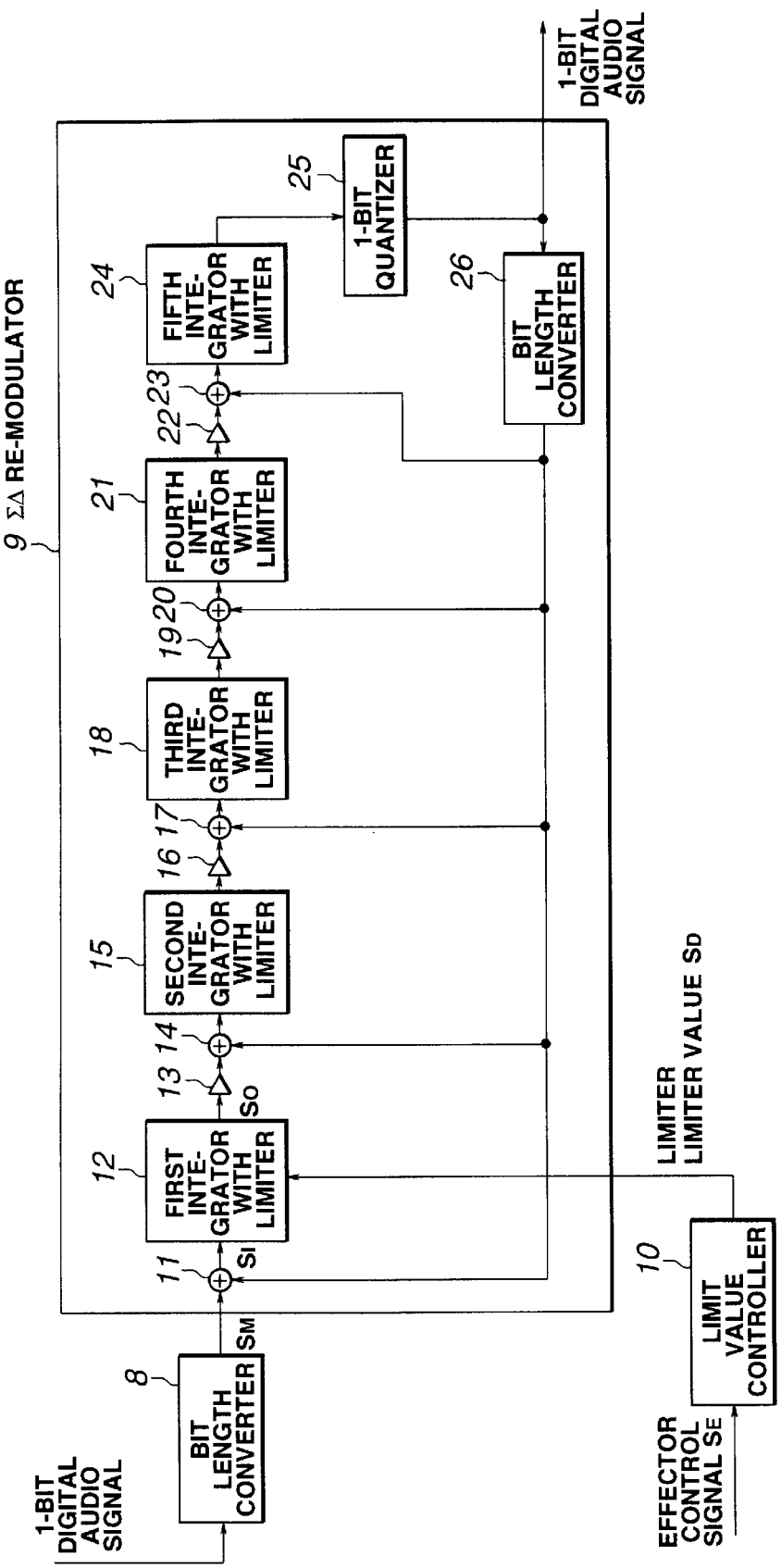
FIG. 1 is a block diagram of a signal processing device according to a first embodiment of the present invention.

Referring to the drawings, preferred embodiments of a special effect processing device according to the present invention will be explained in detail.

The present embodiment is directed to a special effect processing device for applying special effect processing, such as distortion processing, to a 1-bit digital audio signal obtained by ΣΔ modulation.

Referring to FIG. 1, this special effect device includes a bit length converter 8 for converting an input 1-bit digital audio signal into a multi-bit signal, such as a 16-bit signal, a ΣΔ re-modulator 9 for applying a second ΣΔ modulation to the multi-bit output from the bit length converter 8 using an integrator, and a limit value controller 10 for limiting the limit value of a first integrator, fitted with a limiter, as later explained, for integrating the multi-bit output within the ΣΔ re-modulator 9.

Figure 2:
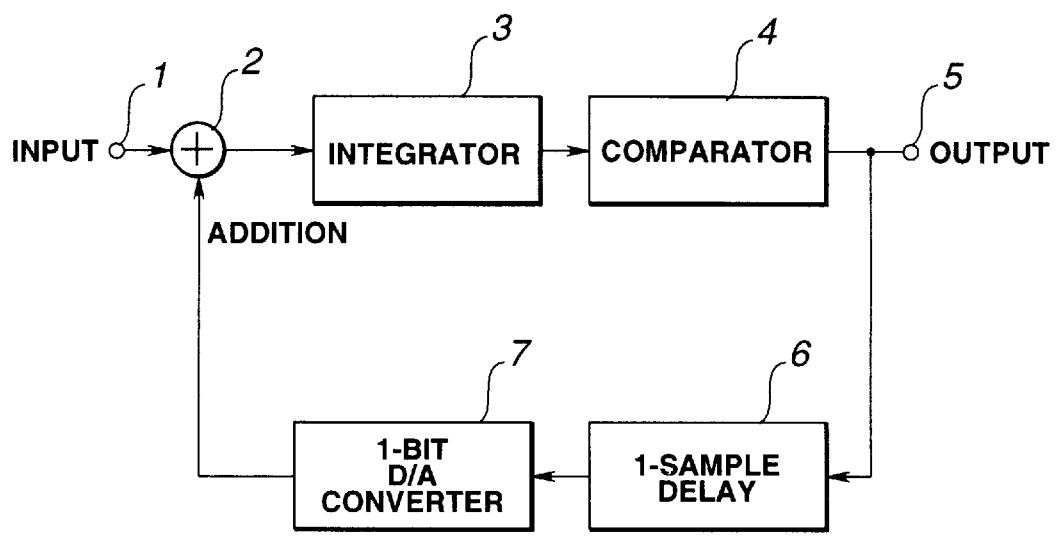
FIG. 2 is a block diagram of a ΣΔ modulator embodying the present invention.

The 1-bit digital audio signal entering the bit length converter 8 is generated in a ΣΔ modulator shown in FIG. 2. The ΣΔ modulator routes the input audio signal entering an input terminal 1 via an adder 2 to an integrator 3. The signal from the integrator 3 is fed to a comparator 4 for comparison to, for example, a neutral point potential ("0" V) of the input audio signal for executing 1-bit quantization every sampling period. The frequency of the sampling period (sampling frequency) is set so as to be 64 or 128 times the conventional frequency of 48 kHz or 44.1 kHz. The quantized data is fed to a 1-sample delay unit 6 so as to be delayed by one sampling period. This delayed data is sent via a 1-bit digital-to-analog (D/A) converter 7 to the adder 2 for being summed to the input audio signal from the input terminal 1. This causes the comparator 4 to output via an output terminal 5 a ΣΔ modulated 1-bit digital audio signal from the input audio signal.

The bit-length converter 8 converts the 1-bit digital audio signal into 16-bit multi-bit data which is routed to the ΣΔ re-modulator 9.

The ΣΔ re-modulator 9 is configured as a five-stage ΣΔ modulator having five integrators with limiters, as shown in FIG. 1. The 16-bit signal from the bit-length converter 8 is integrated via an adder 11 by an integrator having a limiter 12 so as to be multiplied by a coefficient, such as 1/16, by a first coefficient multiplier 13, and thence fed to the second stage. The input signal to the second stage is integrated via an adder 14 by an integrator with a limiter 15 so as to be multiplied by a coefficient, such as 1/8, by a second coefficient multiplier 16 and then fed to the third stage integrator. The input signal to the third stage is integrated via an adder 17 by an integrator with a limiter 18 so as to be multiplied by a coefficient, such as 1/4, by a third coefficient multiplier 19 and then fed to the fourth stage integrator. The input signal to the fourth stage is integrated via an adder 20 by an integrator with a limiter 21 so as to be multiplied by a coefficient, such as 1/2, by a fourth coefficient multiplier 22 and then fed to the fifth stage integrator. The input signal to the fifth stage is integrated via an adder 23 by an integrator 24 with a limiter so as to be then quantized by a 1-bit quantizer 25 to a 1-bit digital audio signal which is outputted. The 1-bit digital audio signal is also converted by a bit length converter 26 into a 16-bit signal which is then fed back to the adders 11, 14, 17, 20 and 23.

The limit value controller 10 is responsive to the effect control signal supplied from an operating panel via central processing unit (CPU) for controlling the limit value of the limiter of the first integrator 12.

The function of the limiters of the first to fifth integrators with limiters 12, 15, 18, 21 and 24 is to prevent oscillations of the ΣΔ re-modulator 9.

In particular, the present special effect processing device controls the limiting value of the limiter of the first integrator 12 by the limit value controller 10 responsive to the effect control signal.

Figure 3:
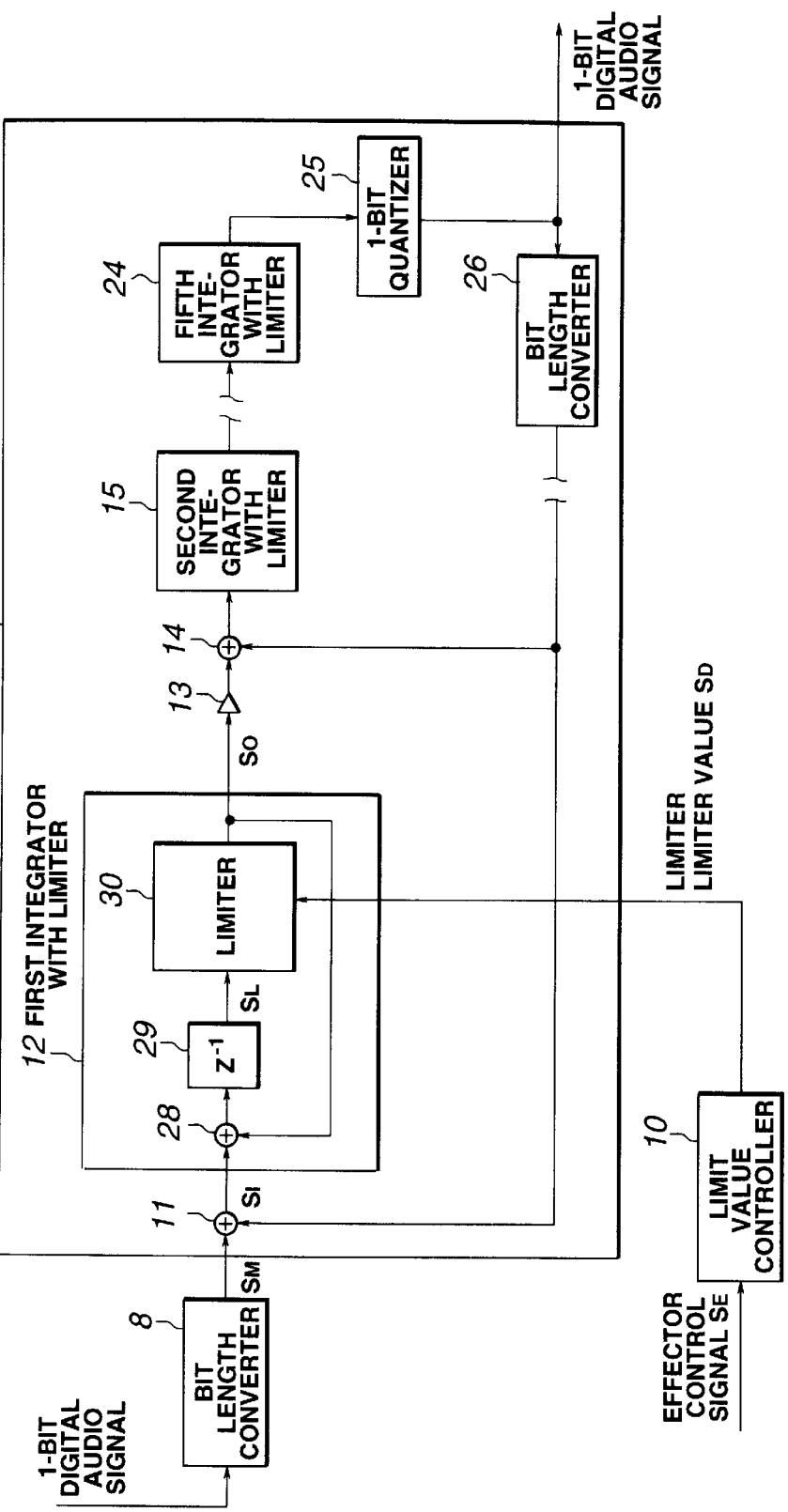
FIG. 3 is a block diagram showing an illustrative structure of an integrator, fitted with a limiter, of the signal processing device shown in FIG. 1.

Referring to FIG. 3, the first integrator with limiter 12 is made up of an adder 28, a shifter 29 and a limiter 30, and is configured for feeding back an output limited by the limiter 30 to the adder 28. In FIG. 3, the third and fourth integrators with limiters are not shown for simplifying the drawing.

The operation of the special effect processing device is explained by referring to FIGS. 4A to 4E. The ΣΔ modulator 9 is fed with a bit length conversion signal (16-bit signal) $S_M$, which becomes an output of the bit length converter 8, as shown in FIG. 4A. An input signal $S_I$ to the first integrator with the limiter 12 enters the first integrator with the limiter 12.

The input signal $S_I$ to the first integrator with the limiter 12 is routed via adder 28 and shifter 20 to become a limiter input value $S_L$ having the maximum amplitude level, as shown in FIG. 4G.

In the present special effect processing device, the limiter value controller 10 generates a limiting value $S_D$, based on the on-timing of the effect control signal $S_E$, corresponding to actuation of the limit value controller 10 by the operating panel, as shown in FIG. 4D, and routes the limiting value SD to the limiter 30.

The limiter 30 then outputs an output signal So of the first integrator with the limiter. The output signal So has shaded portions clipped as shown in FIG. 4E.

The output signal So of the first integrator with the limiter is then multiplied with the above coefficient by the first coefficient multiplier 13 and routed to downstream side components shown in FIG. 1 so as to be outputted as a 1-bit digital audio signal.

If the low-range analog signal component of the 1-bit input signal from the ΣΔ modulator shown in FIG. 2 has a waveform as show in FIG. 5, and the limiter limiting value $S_D$ is fed to the limiter 30 at the on-timing of the effect control signal $S_E$, the low-range analog signal component of the 1-bit input signal from the ΣΔ modulator 9, passed through the integrator, has the maximum amplitude portion thereof exceeding the limiting value, so that the low-range analog signal component has a clipped waveform as from the on-timing of the effect control signal.

Thus, with the present special effect processing device, special effect processing can be directly applied to the 1-bit digital audio signal by a simplified structure.

Figure 6:
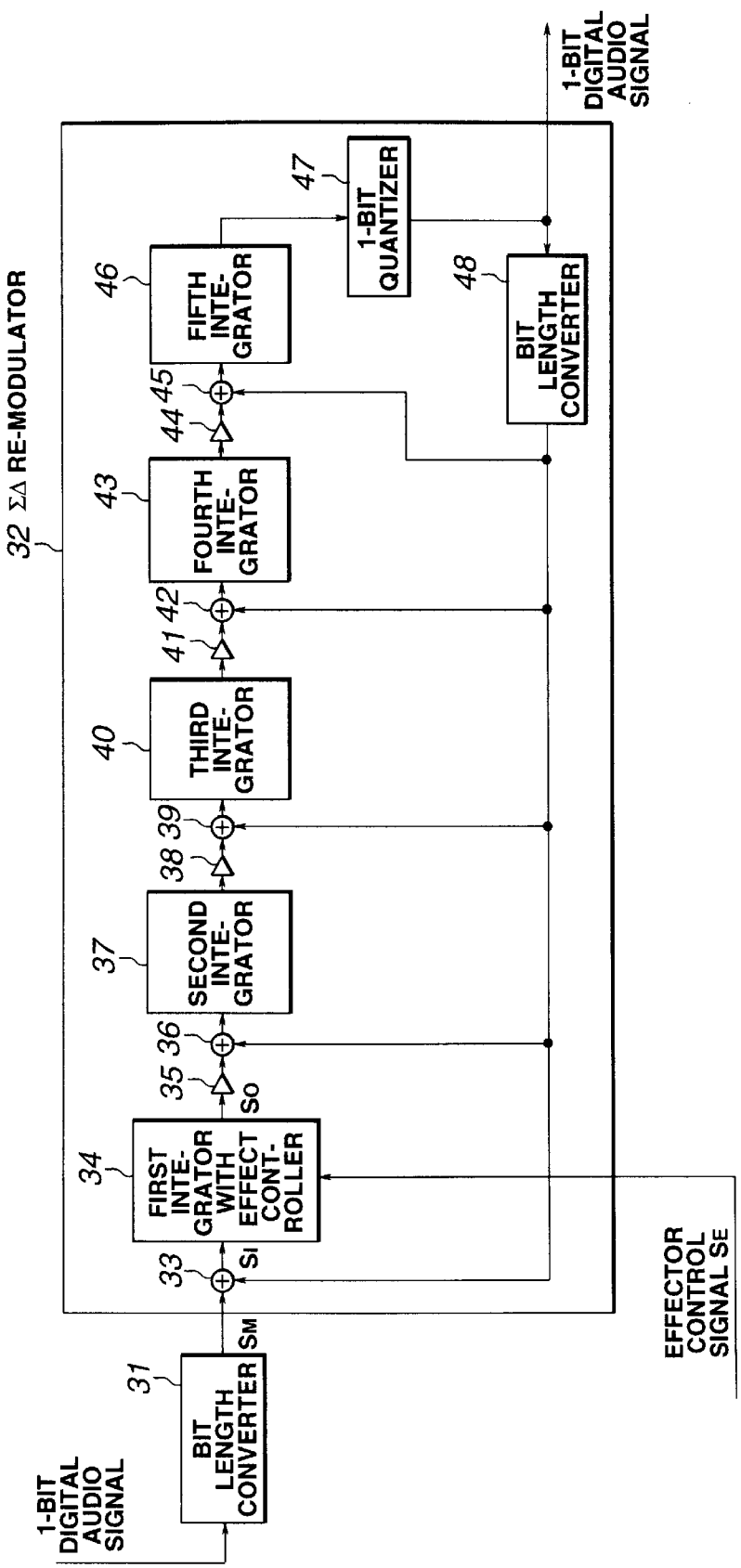
FIG. 6 is a block diagram of a signal processing device as a second embodiment of the present invention.

The special effect processing device according to the present invention may be configured as shown in FIG. 6. This alternative configuration is also a special effect processing device for applying special effect processing, such as distortion processing, to the 1-bit digital audio signal obtained by ΣΔ modulation.

Referring to FIG. 6, the special effect processing device has a bit length converter 31 for converting an input 1-bit digital audio signal into a multi-bit signal, such as 16-bit signal, and a ΣΔ re-modulator 32 for ΣΔ re-modulating the multi-bit output of the bit length converter 31 using an integrator.

The ΣΔ re-modulator 32 is configured as a five-stage ΣΔ modulator having five integrators. In particular, the first integrator has an effect controller so as to serve as a first integrator with an effect controller 34.

The first integrator with the effect controller 34 is responsive to an effect control signal fed from the operating panel via CPU to apply special effect processing to the input multi-bit signal. The first integrator with the effect controller 34 will be explained subsequently.

The 16-bit signal supplied from the bit length converter 31 to the ΣΔ re-modulator 32 is integrated via adder 33 by the first integrator with the effect controller 34 and multiplied by a first coefficient multiplier 35 with a coefficient of, for example, 1/16, so as to be fed to the second stage. This input signal to the second stage is integrated via adder 36 by the second integrator 37 and multiplied by a second coefficient multiplier 38 with a coefficient of, for example, 1/8, so as to be fed to the third stage. The input signal to the third stage is integrated via a third stage adder 39 by the third integrator 40 and multiplied by a third coefficient multiplier 41 with a coefficient of, for example, 1/4, so as to be fed to the fourth stage. The input signal to the fifth stage is integrated via an adder 45 by a fifth integrator 46 and quantized by a one-bit quantizer 47 to a 1-bit digital audio signal which is outputted. The 1-bit digital audio signal is also converted by a bit length converter 48 into a 16-bit signal which is fed back to the adders 33, 36, 39, 42 and 45.

Figure 7:
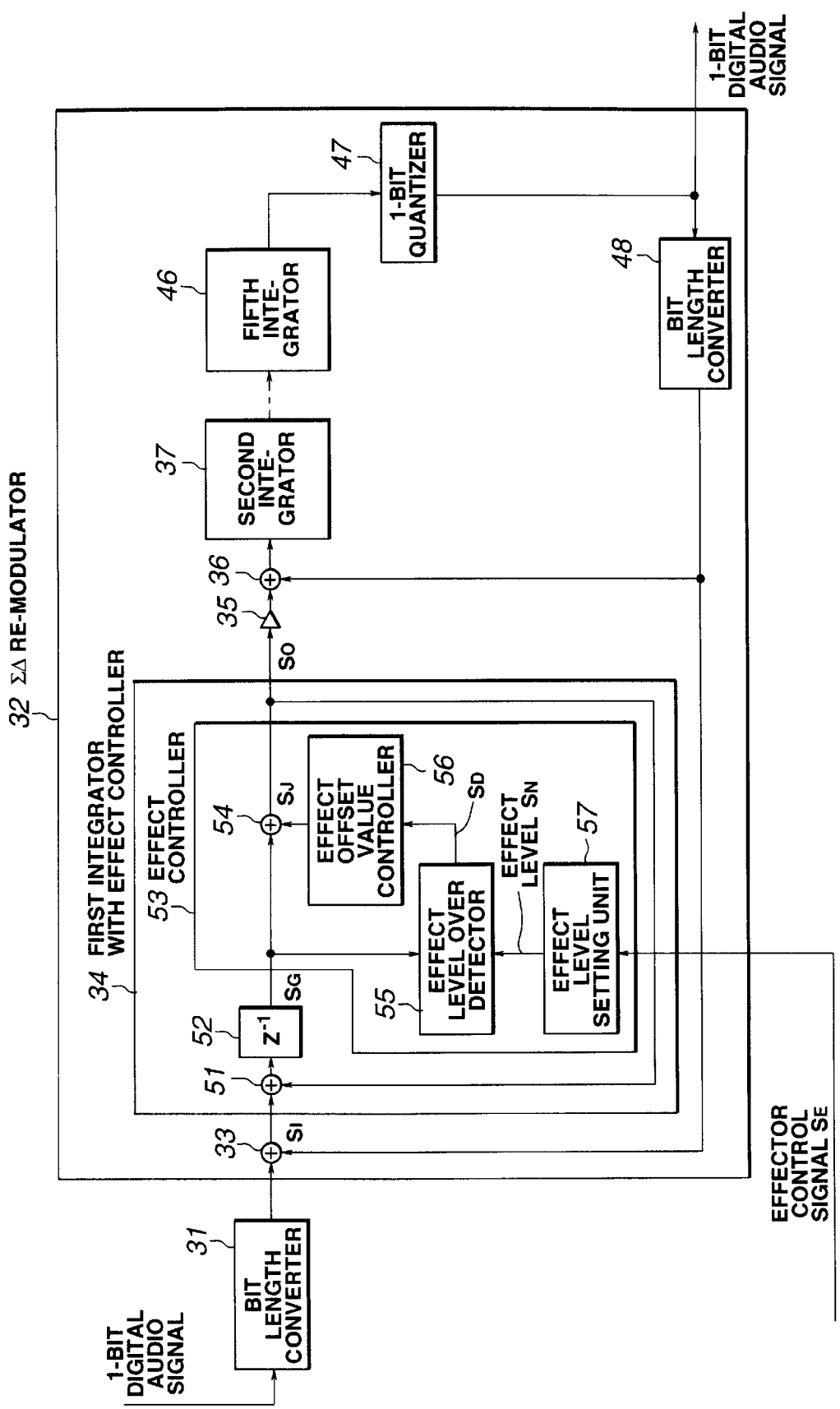
FIG. 7 is a block diagram showing an illustrative structure of a first integrator, with an effect controller, of the signal processing device shown in FIG. 6.

The first integrator with the effect controller 34 has an adder 51, a shifter 52 and an effect controller 53, as shown in FIG. 7.

The effect controller 53 has an effect level setting unit 57 for setting an effect level $S_N$ in the narrowing direction at the on-timing of the effect control signal, and an effect level-over detector 55 for outputting an effect level-over detection signal $S_D$ in case the integrated value $S_G$ supplied from the shifter 52 exceeds the effect level $S_N$. The effect controller 53 also has an effect offset value controller 56 responsive to the effect level over detection signal $S_D$ to add a specified effect offset value $S_J$ to the integrated value $S_C$ by an adder 54.

The operation of the special effect processing device shown in FIGS. 6 and 7 is explained by referring to FIGS. 8A to 8F. If an input signal $S_I$ entering the first integrator with the effect controller 34 via adder 3 has a waveform shown in FIG. 8A, the integrated value $S_G$ outputted by the shifter 52 has a waveform as shown in FIG. 8B.

If the effect level setting unit 57 sets the effect level $S_N$ based on the on-timing of the effect control signal $S_E$ corresponding to actuation by the actuating panel, the effect level-over detector 55 outputs an effect level detection signal $S_D$ shown in FIG. 8D.

The effect offset value controller 56 is responsive to this effect level detection signal $S_D$ to add the effect offset value $S_J$ to the integrated value $S_C$ via adder 54.

Thus the effect controller 53 issues an output having the vicinity of the maximum amplitude portions apparently reduced, as shown in FIG. 8F.

The output So of the first integrator with the effect controller is multiplied by the first coefficient multiplier 35 with the above coefficient and then supplied to the downstream side components shown in FIG. 6 so as to be outputted as a 1-bit digital audio signal.

Thus, with the present special effect processing device, having a simplified structure, the 1-bit digital audio signal can be directly processed with special effect of apparently compressing the maximum amplitude level.

Although it is the first integrator with limiter 12 and the first integrator with the effect controller 34 that are controlled in the above-described first and second embodiments, integrated value control processing may similarly be applied to the second and following integrators using proper limiting values and effect level values.

Also, in the above-described first and second embodiments, the ΣΔ processed 1-bit digital audio signals are entered to the special effect device via bit length converter 8 and 31. Alternatively, the analog audio signals may also be directly supplied to the ΣΔ re-modulators 9 and 32 for controlling to proper limiting values and to proper effect levels for realizing the targeted special effect processing operations.

What is claimed is:

1. A signal processing device for sound field processing a 1-bit digital signal obtained by ΣΔ modulation comprising:

conversion means for converting the 1-bit digital signal into a multi-bit signal;

ΣΔ re-modulation means including an integrator for ΣΔ re-modulating said multi-bit signal converted by said conversion means; and limiting value control means for controlling a limit value of said integrator of said ΣΔ re-modulation means.

2. The signal processing device as claimed in claim 1, wherein said integrator of said ΣΔ re-modulation means is formed of a multi-stage connection of a plurality of integrators, and wherein said integrator controlled by said limiting value control means is one of said plurality of integrators.

3. The signal processing device as claimed in claim 1, wherein said limiting value control means includes signal level decision means for judging whether a signal level of an output of said integrator has exceeded a pre-set level, and wherein when the signal level of an output of said integrator is judged by said signal level, the signal level of said output of said integrator is offset.

4. A signal processing method for sound field processing a 1-bit digital signal obtained ΣΔ modulation comprising the steps of:

converting said 1-bit digital signal into a multi-bit signal;

ΣΔ re-modulating said multi-bit signal converted by said converting step; and controlling a limit value of an integrator forming a ΣΔ re-modulator during ΣΔ re-modulation.

5. The signal processing method as claimed in claim 4, wherein said integrator forming said ΣΔ re-modulator is formed of a multi-stage connection of a plurality of integrators, and wherein said integrator in said controlling step is one of said plurality of integrators.

6. The signal processing method as claimed in claim 4, further comprising:

judging whether a signal level of an output of said integrator output of said integrator controlled in said controlling step has exceeded a pre-set level; and offsetting said signal level of said output of said integrator when said signal level of said output of said integrator is judged to have exceeded said pre-set level.

* * * * *

UNITED STATES PATENT AND TRADEMARK OFFICE
CERTIFICATE OF CORRECTION

PATENT NO.      : 5,859,603
DATED           : January 12, 1999
INVENTOR(S)     : Noguchi et al.

It is certified that error appears in the above-identified patent and that said Letters Patent is hereby corrected as shown below:

Title page,
Item [30], Foreign Application Prioirty Data, add the following:
-- Jul. 31, 1996 [JP]     Japan.......................................08-197545 --

Signed and Sealed this

Nineteenth Day of April, 2005

JON W. DUDAS
*Director of the United States Patent and Trademark Office*